United States Patent
Janssen et al.

(10) Patent No.: US 10,014,158 B1
(45) Date of Patent: Jul. 3, 2018

(54) INNOVATIVE IMAGE PROCESSING IN CHARGED PARTICLE MICROSCOPY

(71) Applicant: FEI Company, Hillsboro, OR (US)

(72) Inventors: Bart Jozef Janssen, Eindhoven (NL); Auke van der Heide, Eindhoven (NL); Henricus Gerardus Roeven, Eindhoven (NL); Jacobus Adrianus Maria Thomassen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/590,857

(22) Filed: May 9, 2017

(51) Int. Cl.
  *H01J 37/22* (2006.01)
  *H01J 37/20* (2006.01)
  *H01J 37/26* (2006.01)

(52) U.S. Cl.
  CPC ........... *H01J 37/222* (2013.01); *H01J 37/20* (2013.01); *H01J 37/261* (2013.01); *H01J 2237/221* (2013.01)

(58) Field of Classification Search
  USPC ........................................................ 250/307
  See application file for complete search history.

(56) References Cited

U.S. PATENT DOCUMENTS

| | | | | |
|---|---|---|---|---|
| 4,916,545 A * | 4/1990 | Granger | ............... | H04N 1/4058 358/3.09 |
| 5,753,913 A | 5/1998 | Coene et al. | | |
| 7,116,830 B2 * | 10/2006 | Srinivasan | ........... | H04N 19/136 382/236 |
| 7,705,364 B2 * | 4/2010 | Lee | .......... | B82Y 20/00 257/104 |
| 7,889,790 B2 * | 2/2011 | Sun | ....... | H04N 19/126 375/240.03 |
| 8,699,792 B2 * | 4/2014 | Fukuda | ................ | H04N 1/4053 382/165 |
| 2008/0304738 A1 | 12/2008 | Beilloin | | |
| 2013/0093931 A1 | 4/2013 | Janssen et al. | | |

(Continued)

OTHER PUBLICATIONS

M. A. Ruzon et. al., "Edge, Junction, and Corner Detection Using Color Distributions", IEEE Transactions on Pattern Analysis and Machine Intelligence, vol. 23, No. 11, Nov. 2001, pp. 1281-1295.*

(Continued)

*Primary Examiner* — Phillip A Johnston
(74) *Attorney, Agent, or Firm* — Scheinberg & Associates, P.C.; Michael O. Scheinberg; John E. Hillert

(57) ABSTRACT

A method of using a charged particle microscope comprising a source; a specimen holder, for holding a specimen; an illuminator, for irradiating the specimen; a detector; and a controller, for controlling at least some aspects of the microscope's operation. The method comprises the steps of using the detector to acquire a series of component images of a part of the specimen; then successively quantizing each component image and storing it in a memory; recording a quantization error per pixel for each quantized component image, and keeping a running tally of cumulative quantization errors per pixel for the quantized component images; when quantizing a next component image, choosing a quantization polarity for each pixel that will avoid further increasing the total quantization error for each pixel. Finally, combining the component images to assemble a composite image.

6 Claims, 2 Drawing Sheets

(56) References Cited

U.S. PATENT DOCUMENTS

Figure 1:
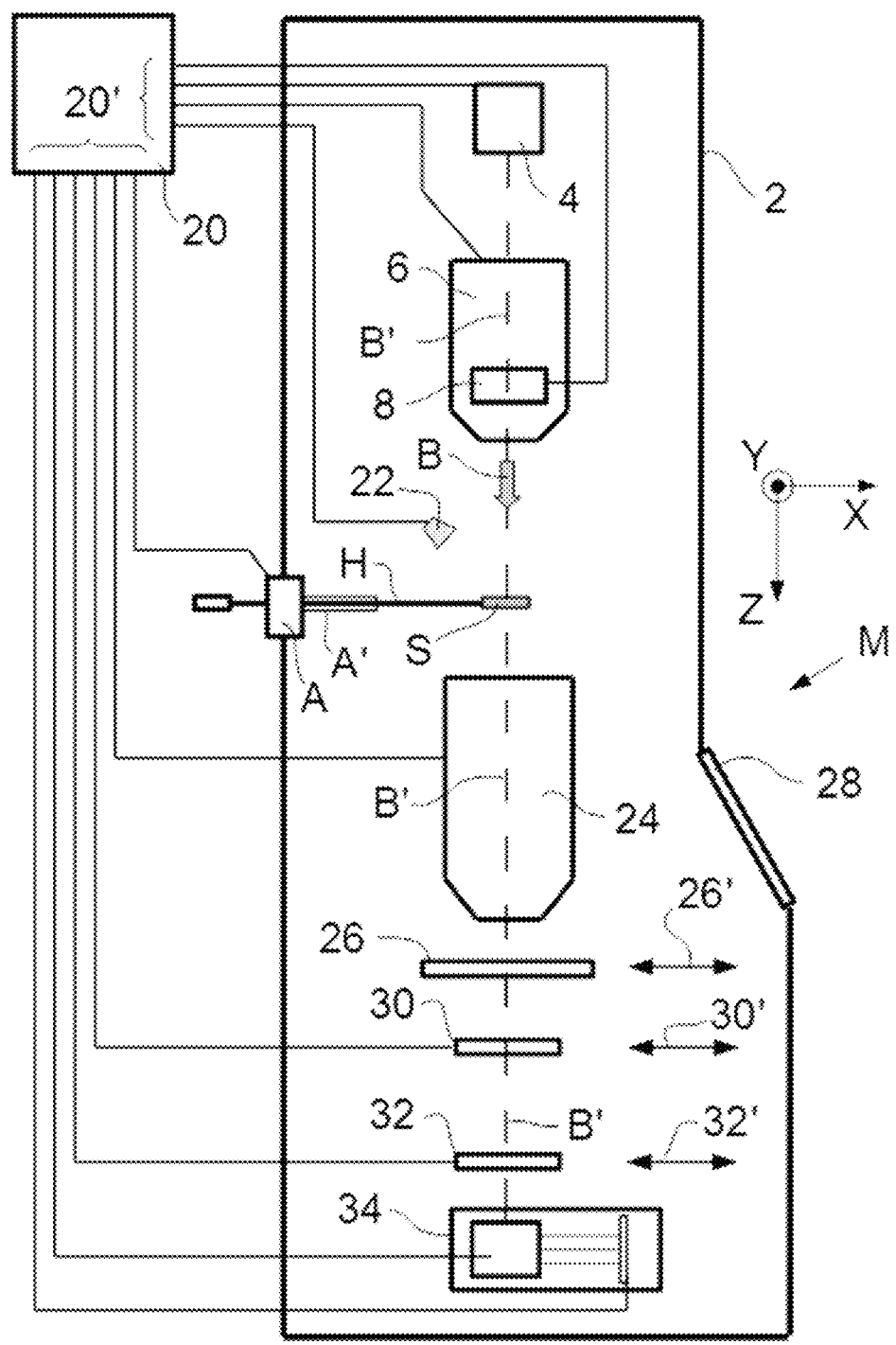

2015/0371815 A1   12/2015   Potocek et al.

OTHER PUBLICATIONS

"Electron Microscope", Wikipedia, Retrieved from the Internet Oct. 15, 2015, http://en.wikipedia.org/wiki/Electron_microscope, 11 pages.

"Floating Point/Fixed-Point Numbers", Wikibooks, Retrieved from the Internet Aug. 21, 2017, https://en.wikibooks.org/wiki/Floating_Point/Fixed-Point_Numbers, 7 pages.

"Focused Ion Beam", Wikipedia, Retrieved from the Internet Jul. 11, 2016, https://en.wikipedia.org/wiki/Focused_ion_beam, 7 pages.

"Quantization (Image Processing)", Wikipedia, Retrieved from the Internet Aug. 21, 2017, http://en.wikipedia.org/wiki/Quantization_(image_processing), 3 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wkipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

\* cited by examiner

INNOVATIVE IMAGE PROCESSING IN CHARGED PARTICLE MICROSCOPY

The invention relates to a method of using a charged particle microscope comprising:
- A source, for producing a beam of charged particles;
- A specimen holder, for holding a specimen;
- An illuminator, for irradiating said specimen with said charged particles;
- A detector, for detecting radiation emanating from the specimen in response to said irradiation;
- A controller, for controlling at least some aspects of the microscope's operation, which method comprises the steps of:
- Using said detector to acquire a successive series of component images $\{I_1, \ldots, I_n, \ldots, I_N\}$ of a given part of the specimen;
- Combining said component images so as to assemble a composite image.

The invention also relates to a charged particle microscope in which such a method can be performed.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
en.wikipedia.org/wiki/Electron_microscope
en.wikipedia.org/wiki/Scanning_electron_microscope
en.wikipedia.org/wiki/Transmission_electron_microscopy
en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
en.wikipedia.org/wiki/Focused_ion_beam
en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975).
www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle source, such as a W or $LaB_6$ source, Schottky gun or Cold Field Emission Gun (CFEG) in the case of electrons, or a Liquid Metal Ion Source (LMIS) or Nano-Aperture Ion Source (NAIS) in the case of ions, for instance.
- An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
- An imaging system (imaging particle-optical column), which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

Acquisition of images in a CPM is generally a relatively complex procedure, in which allowance has to be made for various (competing) factors. For example, specimens typically suffer radiation damage as a result of being irradiated by charged particles, so there is often a preference for relatively low irradiating beam currents/intensities, where possible. This, in turn, will lower the available imaging flux, and will therefore tend to adversely influence the attainable Signal-to-Noise Ratio (SNR). To address these issues, CPM operators often choose to shoot a relatively large succession of component images of a given part of a specimen at a relatively low beam intensity, and then combine these component images into a composite image, e.g. so as to average/distill out the effects of noise. However, such an approach gives rise to certain technical challenges, since:
- On the one hand, there is a desire to store each component image (rather than just the final composite image), for later reference.
- Storing/retrieving a large number (e.g. hundreds) of such images can place huge demands on available memory and processing power.

To address these issues, the component images can be "simplified" before being stored, by subjecting them to a so-called quantization procedure, which effectively reduces the amount of information per pixel, and thus reduces the total file size to be stored/retrieved. See, for example, the following Wikipedia reference:

en.wikipedia.org/wiki/Quantization_(image_processing)

However, in practice, it has been found that combination of such quantized component images into a composite image can yield unexpected/unsatisfactory results—particularly the occurrence of artifacts such as so-called banding errors, for example.

It is an object of the invention to address this issue. More specifically, it is an object of the invention to provide a CPM imaging method in which quantized component images can be combined in a more satisfactory manner into a composite image. In particular, it is an object of the invention that such a composite image should suffer from reduced image artifacts compared to the prior art.

These and other objects are achieved in a method as set forth in the opening paragraph above, characterized by the following steps, executed prior to said combining step:
- Successively quantizing each component image, and storing it in a memory;
- Recording a quantization error per pixel for each quantized component image, and keeping a running tally $T_n$ of cumulative quantization error per pixel for quantized component images $\{I_1, \ldots, I_n\}$;
- When quantizing a next component image $I_{n+1}$, for a given pixel, choosing a quantization polarity that will tend to avoid further increasing $T_{n+1}$ relative to $T_n$, such that:
  If $T_n$ is positive, then $T_{n+1}$ will be less positive;
  If $T_n$ is negative, then $T_{n+1}$ will be less negative;
  If $T_n$ is zero, then $T_{n+1}$ is allowed to be positive, negative or zero.

The basic concept of quantization as here employed is well established in the field of image processing, and will be readily understood by the skilled artisan; nevertheless, for additional information, reference can, for example, be made to the following Wikipedia link:

en.wikipedia.org/wiki/Quantization_(image_processing)

For good order, it should be noted that, as here employed:
"less positive" means a smaller positive value, zero, or a negative value;
"less negative" means a smaller negative value (smaller absolute value), zero, or a positive value.

Inter alia the following aspects of the invention deserve mention:
Quantizing the component images prior to storage greatly reduces the file size of each image, thereby facilitating storage/retrieval of large numbers of component images. This enriches the user's ability to refer at will to given component images at a later juncture, as well as reducing bandwidth requirements for the processing of such images.

Quantization necessarily produces a pixel-by-pixel quantization error, associated with the "rounding" operation that is intrinsic to the quantization process. This error can have a positive or negative polarity/sign, depending on whether a given number is rounded up or rounded down. Contrary to what one might expect, the inventors have observed that, when several quantized images are combined (e.g. summed), their pixelwise quantization errors often tend to reinforce one another rather than tending to cancel out. This can lead to significant "random walk" pixel errors, which can cause image artifacts as referred to above.

The invention combats this effect by explicitly curtailing cumulative quantization errors. To this end, the invention keeps a running (on-the-fly) tally of cumulative quantization error per pixel, and will "steer" the rounding direction/polarity for a pixel $p_{ij}$ in component image $I_{n+1}$ so as to tend to reduce the "live" tally originating from the preceding images $\{I_1, \ldots, I_n\}$. In this manner, runaway errors are prevented, i.e. one seeks to keep the final tally $T_N$ for the entire series of component images as close to zero as is feasible.

Put another way: the invention associates a cost function with (rounding errors in) the quantization process, and seeks to minimize this cost function.

In a particular embodiment of the invention, the quantizing step comprises an action selected from the group comprising:
Conversion of a floating point value to a fixed point value;
Conversion of a fixed point value of a higher width to a fixed point value of a lower width,
and combinations hereof. Such actions effectively "prune" the size of the number that needs to be stored for each pixel, thus reducing the total file size per image. The skilled artisan will understand that the "width" of a fixed point number is the total number of bits assigned for storage thereof. Some background information in this regard can be gleaned from the following Wikibooks reference, for example:
en.wikibooks.org/wiki/Floating_Point/Fixed-Point_Numbers In another embodiment of the invention, prior to said quantizing step, at least some of the component images are subjected to a corrective (cosmetic/enhancement) process selected from the group comprising gain correction, linearization, drift correction, correction of image distortion or aberration, edge enhancement, and combinations hereof.

Such processes tend to cause an increase in the number of bits necessary to faithfully render/store an image (compared to a raw input image), thereby further increasing the need to quantize such processed images prior to storage. These processes typically involve the following:

- Gain correction: It's possible that the gain of the employed detector/amplifier circuitry will vary somewhat on a pixel-by-pixel basis. A pixelwise gain correction can compensate for this effect, and homogenize the effective/resultant gain across the sensor area of the detector.
- Linearization: It's possible that the detector will have a non-linear response, e.g. in that doubling the intensity offered to a given pixel will not result in a doubling of the output signal from that pixel. A linearization correction can compensate for such an effect.
- Drift correction (registration correction): Small positional shifts during acquisition of an image series can result in corresponding registration errors (e.g. offsets) between component images in the series. A drift correction can be used to "align" the component images in the series/stack, so as to make comparison/combination more consistent.
- Aberration/distortion correction: Particle-optical systems upstream of the detector can cause distortion of/aberrations in an image captured by the detector. One can apply corrections for such effects retrospectively.
- Edge enhancement: Transitions/edges/contours in an image are generally somewhat blurred by point spread function effects. If desired, such blurring can be reduced using an edge enhancement algorithm.

The invention will now be elucidated in more detail on the basis of exemplary embodiments and the accompanying schematic drawings, in which:

FIG. 1 renders a longitudinal cross-sectional view of an embodiment of a CPM in which the present invention is implemented.

Figure 2:
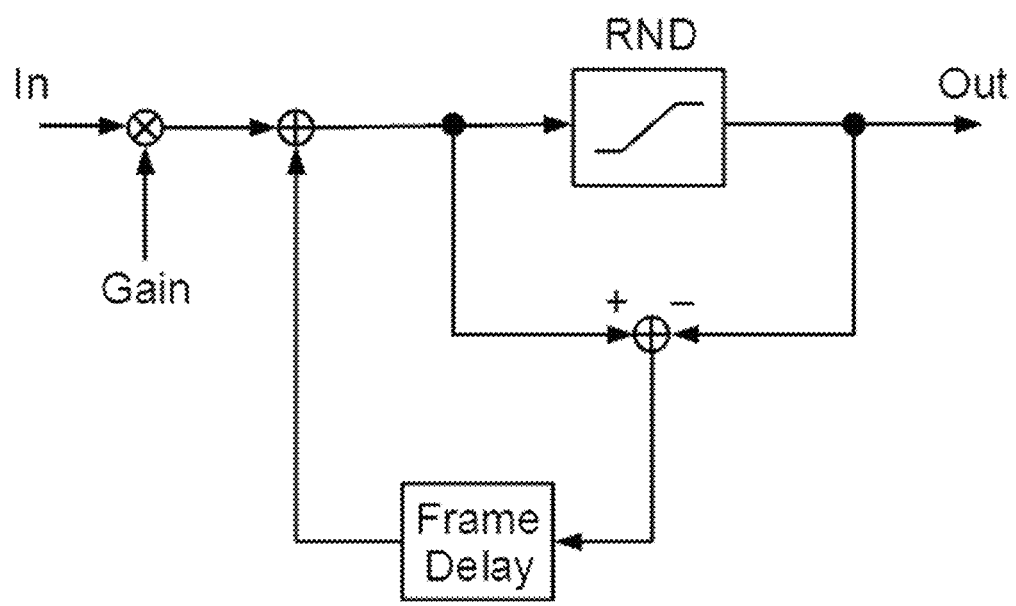

FIG. 2 is a flowchart that renders an algorithmic representation of an embodiment of the invention.

In the Figures, where pertinent, corresponding parts may be indicated using corresponding reference symbols.

EMBODIMENT 1

FIG. 1 (not to scale) is a highly schematic depiction of an embodiment of a charged-particle microscope M in which the present invention can be implemented; more specifically, it shows an embodiment of a transmission-type microscope M, which, in this case, is a TEM/STEM (though, in the context of the current invention, it could just as validly be a SEM, or an ion-based microscope, for example). In the Figure, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

- TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the particular context of the present invention, the processor 20 commands the TEM camera 30 to capture an image series (e.g. comprising ca. 1000 images) of a given area of the specimen S, using a relatively low beam current/dose rate (e.g. 0.02 electrons per pixel per frame). These component images could potentially be stored by processor 20 in a memory—in "raw" form (as-is) and/or in "corrected" form (after application of a corrective process as alluded to above)—but that would require a relatively large quantity of memory per stored image. To address this issue, the component images in the series are successively quantized before storage. In accordance with the invention, a running tally of cumulative quantization error per pixel is kept and continually updated during the quantization process. An algorithm/subroutine in processor 20 ensures that, for a given pixel $p_{ij}$, when quantizing a component image $I_{n+1}$ (of ordinal n+1)—having previously quantized component images $\{I_1, \ldots, I_n\}$ of respective ordinals $\{1, \ldots, n\}$) and kept a running tally $T_n$ of their cumulative quantization error (rounding error)—a (pixelwise) quantization polarity (rounding direction) is chosen that will tend to avoid increasing (a non-zero value of) $T_{n+1}$ relative to $T_n$. So, for example, if rounding up produces a positive contribution to the value of $T_n$, and rounding down produces a negative contribution to the value of $T_n$, and $T_n$ for pixel $p_{ij}$ has a positive value by the time image $I_{n+1}$ is being quantized, then rounding down can be chosen for quantization of pixel $p_{ij}$ in $I_{n+1}$, so as to reduce the positive value of $T_n$—and vice versa. A temporary exception to this rule occurs when $T_n$ already equals zero, in which case $T_{n+1}$ is allowed to assume a non-zero magnitude, which will then be further reduced when quantizing image $I_{n+2}$, etc. The end effect here is that, by the time all images in the captured series have been quantized, the final tally $T_N$ for each pixel is equal to zero, or as close thereto as feasible.

FIG. 2 shows a flowchart that schematically illustrates an algorithm as described above. In this flowchart:

"RND" indicates a rounding operation (quantization);
"Frame Delay" represents a temporal interval between (capture of) successive component images in a given series/stack.

The invention claimed is:

1. A method of using a charged particle microscope comprising:
   a source, for producing a beam of charged particles;
   a specimen holder, for holding a specimen;
   an illuminator, for irradiating said specimen with said charged particles;
   a detector, for detecting radiation emanating from the specimen in response to said irradiation; and
   a controller, for controlling at least some aspects of the operation of the charged particle microscope,
   which method comprises:
      using said detector to acquire a successive series of component images $\{(I_1, \ldots, I_n, \ldots, I_N\}$ of a given part of the specimen; and
      successively quantizing each component image, and storing it in a memory;
      recording a quantization error per pixel for each quantized component image, and keeping a running tally $T_n$ of cumulative quantization error per pixel for quantized component images $\{I_1, \ldots, I_n\}$; and
      when quantizing a next component image $I_{n+1}$, for a given pixel, choosing a quantization polarity that will tend to avoid further increasing $T_{n+1}$ relative to $T_n$, such that:
         if $T_n$ is positive, then $T_{n+1}$ will be less positive;
         if $T_n$ is negative, then $T_{n+1}$ will be less negative; and
         if $T_n$ is zero, then $T_{n+1}$ is allowed to be positive, negative or zero combining said component images so as to assemble a composite image.

2. A method according to claim 1, wherein said quantizing involves at least one action selected from the group consisting of:
   conversion of a floating point value to a fixed point value; and
   conversion of a fixed point value of a higher width to a fixed point value of a lower width.

3. A method according to claim 1, wherein, prior to said quantizing, at least some of the component images are subjected to at least one corrective process selected from the group consisting of gain correction, linearization, drift correction, correction of image distortion or aberration, and edge enhancement.

4. A method of using a charged particle microscope comprising:
   a source, for producing a beam of charged particles;
   a specimen holder, for holding a specimen;
   an illuminator, for irradiating said specimen with said charged particles;
   a detector, for detecting radiation emanating from the specimen in response to said irradiation; and
   a controller, for controlling at least some aspects of the operation of the charged particle microscope, which method comprises:
      using said detector to acquire a successive series of component images $\{I_1, \ldots, I_n, \ldots, I_N\}$ of a given part of the specimen; and
      successively quantizing each component image, and storing it in a memory;
      recording a quantization error per pixel for each quantized component image, and keeping a running tally $T_n$ of cumulative quantization error per pixel for quantized component images $\{I_1, \ldots, I_n\}$;

when quantizing a given component image, for a given pixel, choosing a quantization polarity that will result in an ultimate value of $T_N$ that is zero, or as close thereto as feasible; and combining said component images so as to assemble a composite image.

5. A method of using a charged particle microscope comprising:

a source, for producing a beam of charged particles;

a specimen holder, for holding a specimen;

an illuminator, for irradiating said specimen with said charged particles;

a detector, for detecting radiation emanating from the specimen in response to said irradiation; and a controller, for controlling at least some aspects of the operation of the charged particle microscope, which method comprises:

using said detector to acquire a successive series of component images $\{I_1, \ldots, I_n, \ldots, I_N\}$ of a given part of the specimen;

successively quantizing each component image, and storing it in a memory;

associating a cost function with a quantization error per pixel for each quantized component image;

when quantizing a given component image, for a given pixel, choosing a quantization polarity that will result in a minimized value of said cost function; and combining said component images so as to assemble a composite image.

6. A method according to claim 2, wherein, prior to said quantizing, at least some of the component images are subjected to at least one corrective process selected from the group consisting of gain correction, linearization, drift correction, correction of image distortion or aberration, and edge enhancement.

* * * * *